United States Patent [19]

Bianco

[11] Patent Number: 4,891,254

[45] Date of Patent: Jan. 2, 1990

[54] ARTICLE WITH EMBEDDED OPTICALLY-READABLE IDENTIFICATION MEANS AND METHOD FOR MAKING SAME

[76] Inventor: James S. Bianco, 217 Brainard Rd., Enfield, Conn. 06082

[21] Appl. No.: 208,088

[22] Filed: Jun. 17, 1988

[51] Int. Cl.⁴ ............................................. B32B 1/04
[52] U.S. Cl. ..................................... 428/78; 428/76; 428/195; 428/204; 428/206; 428/207; 428/208; 428/209; 428/458; 235/487; 235/488; 235/473.5; 235/473; 156/60; 156/155; 156/298; 156/307.1; 156/308.2; 156/311
[58] Field of Search ............... 235/487, 488; 428/195, 428/204, 206, 207, 208, 209, 458, 68, 76, 473.5; 156/60, 155, 298, 307.1, 308.2, 311

[56] References Cited

U.S. PATENT DOCUMENTS

| 4,023,208 | 5/1977 | Feit et al. | 360/122 |
| 4,263,503 | 4/1981 | Bianco | 235/487 |
| 4,680,460 | 7/1987 | Dresler | 235/488 |
| 4,745,268 | 5/1988 | Presler | 235/487 |

Primary Examiner—Ellis P. Robinson
Assistant Examiner—P. J. Ryan
Attorney, Agent, or Firm—John H. Crozier

[57] ABSTRACT

Optically-readable identification means embedded in an article to be identified. One method of the invention is to apply the identification means to an article and then subsequently cover the article, at least in the area of the identification means, with a protective layer so that the identification means becomes an integral part of the article. In the case of fiberglass articles, the identification means is applied to the article before the final layer of epoxy or polyester is applied. In one preferred embodiment for high temperature applications, there is provided an embeddable bar code strip comprising a bar code which can withstand high temperatures disposesd on a polymeric carrier substrate which is stable at temperatures to at about 500 degrees Fahrenheit. This bar code is preferably iron powder placed on a polyimide substrate by means of xerographic copying. In another preferred embodiment, for nonreflective articles, one surface of the carrier substrate is coated with aluminum by vapor deposition.

14 Claims, 2 Drawing Sheets

ARTICLE WITH EMBEDDED OPTICALLY-READABLE IDENTIFICATION MEANS AND METHOD FOR MAKING SAME

BACKGROUND OF THE INVENTION

1. Field of the Invention

The present invention generally relates to optically-readable identification means, such as bar codes, and, more particularly, to a method of producing an article having such identification means protectively embedded in the article.

2. Background Art

While the present invention is described as being applied to bar codes, it will be understood that it may be applied as well to other optically-readable identification means suitable for embedding by the methods described herein.

Bar codes have found application in a variety of applications as an information source, typically for digital processors. Such codes are used at point-of-sale merchandising for pricing and inventory count, in controlled personnel access systems, in manufacturing for work-in-process and inventory control, and for subsequent article identification after manufacture, to name only a few applications. The bar codes themselves comprise a series of parallel lines, with each line typically in the range of ¼" to 1' in length and 1 to 50 mils in thickness, and are usually printed with black ink on a white background. The lines may variously have unequal spacing and/or unequal thickness, with the variations in spacing and/or thickness determined by the information "stored" in the bar code. A bar code is "/read" by serailly illuminating the bars, with the bars absorbing the and the background reflecting the. The resulting pattern of reflection and nonreflection is sensed by a light detecting device which provides input to the digital processor.

Typically, the bar codes are printed with carbon ink on a paper or plastic substrate and adhesively attached to an article. When some articles such as machinery and equipment are to be identified, the bar code may be attached to a metal or plastic tag which may be riveted or screwed to the article. While such an arrangement is satisfactory for many applications, these externally-applied labels or tags are subject to being removed, such as by physical abrasion, vandalism, weathering, and/or exposure to liquids, for example. Additionally, where a tag is attached by means such as screwing or riveting, the integrity of the article to which the tag is attached may be comprised. The problem may also exist where the bar code is ground or etched into the surface of the article. Also, most such bar codes are unsatisfactory for use at high temperatures, say on the order of 500 degrees Fahrenheit, because the wax usually used in the carbon ink may melt and run and/or the paper or plastic substrate may char or burn.

When the bar code is to be used at high temperatures, it may take one of two forms. In one, a metal light-reflective surface, say an aluminum plate, is provided for attachment to the article and the bar code is placed on the plate using a high temperature paint. In the other, when the physical properties of the article permit, the bar code may be ground or etched into the surface of the article itself. Each one of these known methods is expensive and time-consuming.

Accordingly, it is a principal object of the present invention to provide a bar code or other identification means which is protectively embedded in the article to be identified and becomes an integral part thereof.

It is an additional object of the present invention to provide such a bar code suitable for use at high temperatures.

It is a further object of the present invention to provide such a bar code that can be easily and conveniently embedded in an article.

Other objects of the present invention, as well as other particular features and advantages thereof, will, in part, be obvious, and will, in part, be apparent from the following description and the accompanying drawing figures.

SUMMARY OF THE INVENTION

The present invention substantially overcomes the limitations of prior known identification means and methods by providing optically-readable identification means for embedding in the articles to be identified. One method of the invention is to apply the identification means to an article and then subsequently cover the article, at least in the area of the identification means, with a protective layer such that the identification means becomes an integral part of the article. In the case of fiberglass articles, the identification means is applied to the article before the final layer of epoxy or polyester is applied. In one preferred embodiment for high temperature applications, there is provided an embeddable bar code strip comprising a bar code which can withstand high temperatures disposed on a polymeric carrier substrate which is stable at temperatures to at about 500 degrees Fahrenheit. This bar code is preferably iron powder placed on a polyimide substrate by means of xerographic copying. In another preferred embodiment, for nonreflective articles, one surface of the carrier substrate may coated with aluminum by vapor deposition.

DETAILED DESCRIPTION OF THE PREFERRED EMBODIMENTS

Figure 1:
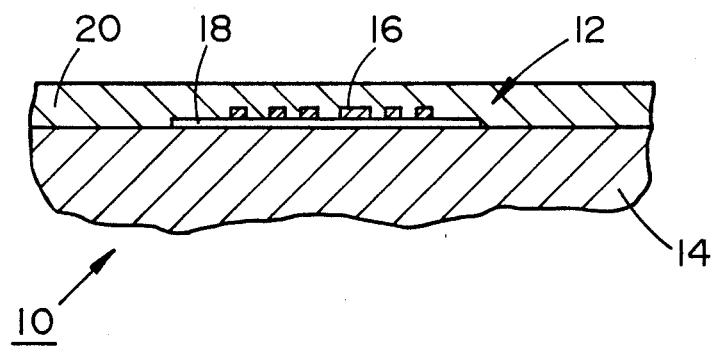
FIG. 1 is an enlarged, cross-sectional view of a bar code embedded in an article to be identified, according to the present invention.

Referring now to the Drawing, FIG. 1 shows a cross-sectional view of an article, generally indicated by the reference numeral 10, having embedded therein identification means, in this case a bar code strip, generally indicated by the reference numeral 12. Article 10 includes a base member 14 which may be a shell or the body of the article upon which bar code 12 has been placed during manufacture of the article. The "bars", as at 16, may be formed on a carrier substrate 18, which substrate may be any suitable material known in the art which will not undesirably react with the embedding materials, or they may be formed directly on the base by printing or other means known in the art. The latter technique is particularly useful where inclusion of a substrate could cause a structural flaw. It may be assumed that the view on FIG. 1 (as well as those on FIGS. 2–4) is taken so as to intersect bars 16 perpendicularly to their longitudinal axes.

Once bar code 12 is placed or formed on base 14, the bar code and the base are covered with optically-transparent layer 20. If bar code 12 is to be visually read, layer 20 will, of course, be a visually transparent material. However, if the bar code is to be read other than visually, say with infrared light for example, layer 20 may be visually opaque but transparent to infrared light. When article 10 is constructed of fiberglass, layer 20 may be a finishing layer of epoxy or polyester material. Layer 20 need not necessarily cover the entire surface of base member 14, but will cover at least the bar code. Layer 20 also need not necessarily comprise a curable liquid, but may comprise an optically-transparent sheet which is incorporated into the article by adhesion or otherwise.

Figure 2:
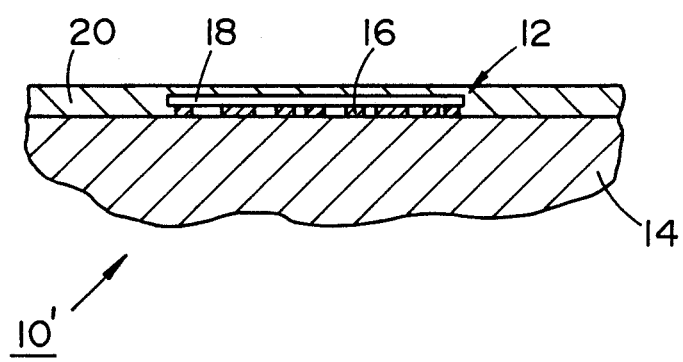
FIG. 2 is a variation of the embodiment of FIG. 1.

FIG. 2 shows a cross-sectional view of an article with embedded identification means comprising a bar code strip having a carrier substrate disposed on the side of the bars opposite that shown on FIG. 1. For convenient reference, elements on FIG. 2 common to FIG. 1 are given corresponding primed reference numerals.

Figure 3:
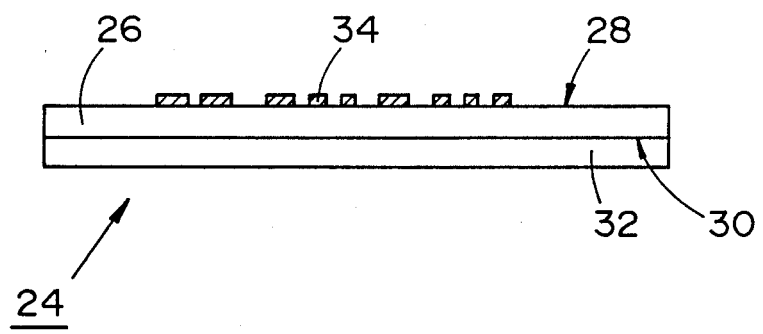
FIG. 3 is an enlarged, cross-sectional view of a bar code strip of the present invention suitable for embedding in a fiberglass article.

FIG. 3 shows a cross-sectional view of a bar code strip, generally indicated by the reference numeral 24, which bar code strip is particularly adapted for use with fiberglass articles and/or in the manufacture of an article as shown on FIG. 2. Bar code strip 24 includes an optically-transparent carrier substrate 26, having first and second surfaces 28 and 30, respectively, and being releasably attached to release paper 32. Release paper 32 is provided for ease of handling of bar code strip 24. Disposed on first surface 28 of substrate 26 is a pattern or series of bars, as at 34. To mark an article, bar code strip 24 may be placed with first surface 28 in contact with, for example, the body (not shown) of a fiberglass article which has not yet cured, and then release paper 32 is removed. When the final coat of opoxy or polyester is applied to the article and cures, bar code strip 24 becomes an integral part of the fiberglass article without the need for an adhesive layer or other attachment means. If desired, a suitable protective layer (not shown) may be placed on top of first surface 28 so that bars 34 do not become damaged in handling, which protective layer may also become an integral part of the article in which bar code strip 30 will be embedded, or the protective layer may be releasable.

When the application is one in which the marked article will be used at elevated temperatures, optically-transparent substrate 26 is preferably a relatively flexible polymeric sheet suitable for use at temperatures on the order of about 500 degreess Fahrenheit. A polymer suitable for such use is Kapton, a polyimide material manufactured by E I DePont. Bars 34, rather than being of a conventional ink or paint, are of a material more suitable for high temperatures. Preferably, such material is iron powder.

For such high temperature applications, bar code strip 24 is preferably and simply manufactured by placing second surface 30 of substrate 26 onto release paper 32. The resulting subassembly is then passed through a xerographic copier which copies bars 34 from a master (not shown) onto first surface 28 of substrate 26, the bars thus being formed of iron powder. Also, since the surface of a fiberglass article is usually reflective, there is no need to provide a reflective surface within or under bar code strip 24.

Figure 4:
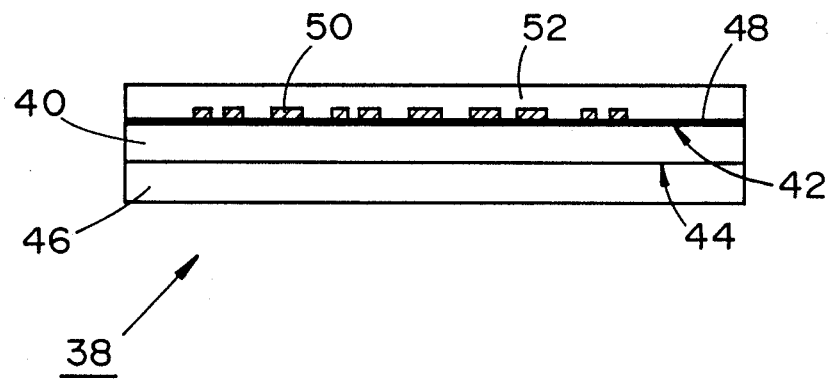
FIG. 4 is an enlarged, cross-sectional view of a bar code strip of the present invention suitable for embedding in a nonreflective article.

Referring now to FIG. 4, there is shown a bar code strip according to the present invention, generally indicated by the reference numeral 38, which bar code strip is adapted to be embedded in a nonreflective article. Bar code strip 38 includes a substrate 40, of any suitable material, having first and second surfaces 42 and 44, respectively. Second surface 44 of substrate 40 may be releasably attached to a release paper 46. Since bar code strip 38 will not necessarily be used on an article that is inherently reflective, it is necessary to provide a reflective surface within the bar code. This is preferably accomplished by placing a reflective metal layer 48 on first surface 42 of substrate 40. Bars, as at 50, are placed on the upper surface of metal layer 48 and an optically-transparent sheet 52 may be placed over the bars to protect them.

For high temperature applications, transparent sheet 52 may be attached to bars 50 and metal layer 48 with a high temperature adhesive. As with the high temperature embodiment of bar code strip 22 of FIG. 3, substrate 40 is preferably a high temperature polymeric material and bars 50 are preferably iron powder. Transparent sheet 52 is also preferably of a high temperature polymeric material. Metal layer 48 may be of any suitable material and may be placed on first surface 42 of substrate 40 by any means known in the art, but is preferably a layer of aluminum a few microns in thickness applied by vapor deposition. The high temperature adhesive may be any of a number of high temperature adhesives known in the art.

Also for high temperature applications, bar code strip 38 is preferably and simply manufactured by releasably attaching second surface 44 of substrate 40 to release paper 46. First surface 42 of substrate 40 is then coated with metal layer 48 by the vapor deposition of aluminum. The resulting subassembly is then passed through a xerographic copier where bars 50 of iron powder are placed on metal layer 48, following which transparent sheet 52 is attached to bars 50 and metal layer 48 with a high temperature adhesive. When it is desired to place bar code strip 38 on an article, release paper 46 is removed, and the bar code strip may be attached to the article by means of a high temperature adhesive or placed on an uncured fiberglass surface without adhesive as described above. Bar code strip 38 is then embedded as described above.

While the present invention has been described as providing a single bar code strip, it will be understood that bar code strips may be more conveniently manufactured by making a plurality of such strips in a sheet and then cutting out individual strips after manufacture.

It will thus be seen that the objects set forth above, among those made apparent from the preceding description, are efficiently attained and, since certain changes may be made in the above construction without departing from the scope of the invention, it is intended that all matter contained in the above description or shown on the accompanying drawing figures shall be interpreted as illustrative and not in a limiting sense.

It is also to be understood that the following claims are intended to cover all of the generic and specific factures of the invention herein described, and all statements of the scope of the invention which, as matter of language, might be said to fall therebetween.

I claim:

1. An article having embedded therein optically-readable identification means, comprising:

(a) a base member, said base member having a surface;
(b) identification means disposed upon a high-temperature-resistant polymeric carrier substrate;
(c) said carrier substrate being disposed upon said surface; and
(d) an integral protective layer disposed upon said surface, said protective layer covering at least said identification means to embed said identification means within said aritcle.

2. An article, as defined in claim 1, wherein said high-temperature-resistant polymeric material is a polyimide.

3. An article, as defined in claim 1, wherein said identification means is formed of iron powder.

4. An article having embedded therein optically-readable identification means, comprising:
(a) a base member, said base member having a surface;
(b) identification means disposed upon a carrier substrate;
(c) said carrier substrate being disposed upon said surface;
(d) a reflective layer disposed between said identification means and said carrier substrate; and
(e) an integral protective layer disposed upon said surface, said protective layer covering at least said identification means to embed said identification means within said article.

5. An article, as defined in claim 4, wherein said reflective layer is vapor-deposited aluminum.

6. A fiberglass article having embedded therein optically-readable identification means, comprising:
(a) a base surface;
(b) identification means disposed upon said base surface; and
(c) an integral layer, comprising the final layer of said fiberglass article, disposed upon said surface, said integral layer covering at least said identification means to embed said identification means within said article.

7. A method of making an article having embedded therein optically-readable identification means, comprising:
(a) providing a base surface of said article;
(b) placing said identification means upon a high-temperature-resistant polymeric carrier substrate;
(c) then, placing upon said base surface said carrier substrate; and
(d) finally, placing an integral protective layer upon said base surface covering at least said identification means to embed said identification means within said article.

8. A method, as defined in claim 7, wherein said high-temperature-resistant polymeric material is a polyimide.

9. A method, as defined in claim 7, wherein said identification means is formed of iron powder.

10. A method of making an article having embedded therein optically-readable identification means, comprising:
(a) providing a base surface of said article;
(b) providing a carrier substate having thereon identification means, with a reflective layer between said identification means and said carrier substrate;
(c) then, placing said carrier substrate upon said base surface; and
(d) finally, placing an integral protective layer upon said base surface covering at least said identification means to embed said identification means within said article.

11. A method, as defined in claim 6, wherein said reflective layer is vapor-deposited aluminum.

12. A method of making a fiberglass article having embedded therein optically-readable identification means, comprising:
(a) providing a uncured base surface of said article;
(b) then, placing upon said uncured base surface, said identification means before said base surface has cured; and
(c) finally, allowing said base surface to cure, thereby adhering said identification means to said base surface without additional adhesive.

13. A method of making a fiberglass article, as defined in claim 12, further comprising:
(d) placing an integral layer, comprising the final layer of said fiberglass article, covering at least said identification means to embed said identification means within said article.

14. A method, as defined in claim 9, wherein the method of making said identification means comprises passing said substrate through a xerographic copier whereby to copy a master of said identification means upon said substrate, resulting in an image formed by iron powder in said xerographic copier.

* * * * *

UNITED STATES PATENT AND TRADEMARK OFFICE
CERTIFICATE OF CORRECTION

PATENT NO. : 4,891,254

DATED : January 2, 1990

INVENTOR(S) : James S. Bianco

It is certified that error appears in the above-identified patent and that said Letters Patent is hereby corrected as shown below:

Column 6, line 24, claim 11, should be changed to read
—11. A method, as defined in claim 10, wherein said—.

Signed and Sealed this

Seventeenth Day of April, 1990

Attest:

HARRY F. MANBECK, JR.

*Attesting Officer*     *Commissioner of Patents and Trademarks*